US009490386B2

(12) United States Patent
Korevaar et al.

(10) Patent No.: US 9,490,386 B2
(45) Date of Patent: Nov. 8, 2016

(54) METHODS OF FABRICATING A PHOTOVOLTAIC MODULE, AND RELATED SYSTEM

(71) Applicant: First Solar Malaysia Sdn. Bhd., Kulim (MY)

(72) Inventors: Bastiaan Arie Korevaar, Schenectady, NY (US); Jinbo Cao, Rexford, NY (US); Adam Fraser Halverson, Niskayuna, NY (US); Scott Daniel Feldman-Peabody, Golden, CO (US); Mark Jeffrey Pavol, Arvada, CO (US); Douglas Garth Jensen, Lakewood, CO (US)

(73) Assignee: FIRST SOLAR, INC., Tempe, AZ (US)

( * ) Notice: Subject to any disclaimer, the term of this patent is extended or adjusted under 35 U.S.C. 154(b) by 0 days.

(21) Appl. No.: 15/041,814

(22) Filed: Feb. 11, 2016

(65) Prior Publication Data
US 2016/0163911 A1  Jun. 9, 2016

Related U.S. Application Data (63) Continuation of application No. 13/713,697, filed on Dec. 13, 2012, now Pat. No. 9,276,147.

(51) Int. Cl.
*H01L 31/18* (2006.01)
*H01L 31/0392* (2006.01)
(Continued)

(52) U.S. Cl.
CPC ..... *H01L 31/1864* (2013.01); *H01L 31/03925* (2013.01); *H01L 31/048* (2013.01);
(Continued)

(58) Field of Classification Search
CPC ........... H01L 31/03925; H01L 31/048; H01L 31/073; H01L 31/18; H01L 31/1828; H01L 31/1864; Y02E 10/543; Y02P 70/521
See application file for complete search history.

(56) References Cited

U.S. PATENT DOCUMENTS 6,503,831 B2  1/2003  Speakman
7,026,258 B2  4/2006  Taunier et al.
(Continued)

FOREIGN PATENT DOCUMENTS

EP       2579386 A1    4/2013
KR     1020030045116   1/2005
(Continued)

OTHER PUBLICATIONS

Albin et al., "Growth Temperature and Stoichiometry Effects on the Inherent Stability of CdS/CdTe Solar Cells", AVS 59th International Symposium & Exhibition, 2012, pp. 1. 27.
(Continued)

*Primary Examiner* — Marvin Payen
*Assistant Examiner* — Victor Barzykin
(74) *Attorney, Agent, or Firm* — MacMillan, Sobanski & Todd, LLC (57) ABSTRACT

A method of processing a semiconductor assembly is presented. The method includes fabricating a photovoltaic module including a semiconductor assembly. The fabrication step includes performing an efficiency enhancement treatment on the semiconductor assembly, wherein the efficiency enhancement treatment includes light soaking the semiconductor assembly, and heating the semiconductor assembly. The semiconductor assembly includes a window layer having an average thickness less than about 80 nanometers, wherein the window layer includes cadmium and sulfur. A related system is also presented.

24 Claims, 9 Drawing Sheets

(51) Int. Cl.
*H01L 31/048* (2014.01)
*H01L 31/073* (2012.01)

(52) U.S. Cl.
CPC ............ *H01L31/073* (2013.01); *H01L 31/18* (2013.01); *H01L 31/1828* (2013.01); *Y02E 10/543* (2013.01); *Y02P 70/521* (2015.11)

(56) References Cited

U.S. PATENT DOCUMENTS

| | | |
|---|---|---|
| 8,143,515 B2 | 3/2012 | Gossman et al. |
| 2003/0205268 A1 | 11/2003 | Nakamura et al. |
| 2006/0261341 A1 | 11/2006 | Akimoto et al. |
| 2010/0073011 A1 | 3/2010 | Svidenko et al. |
| 2010/0147347 A1 | 6/2010 | Dyreby et al. |
| 2010/0186810 A1 | 7/2010 | Romeo |
| 2011/0020959 A1 | 1/2011 | Wieting |
| 2011/0030891 A1 | 2/2011 | Feng et al. |
| 2011/0197967 A1 | 8/2011 | Kaijo et al. |
| 2011/0237021 A1 | 9/2011 | Gloeckler et al. |
| 2011/0259423 A1 | 10/2011 | Korevaar et al. |
| 2011/0265865 A1 | 11/2011 | Korevaar |
| 2012/0021536 A1 | 1/2012 | Feldman-Peabody et al. |
| 2012/0061235 A1 | 3/2012 | Feldman-Peabody |
| 2012/0132268 A1 | 5/2012 | Rojo et al. |
| 2012/0180858 A1 | 7/2012 | Zhong et al. |
| 2012/0260978 A1 | 10/2012 | Korevaar et al. |
| 2014/0109949 A1 | 4/2014 | Avellan et al. |

FOREIGN PATENT DOCUMENTS

| | | |
|---|---|---|
| WO | 2011148878 A1 | 12/2011 |
| WO | 2013000894 | 1/2013 |

OTHER PUBLICATIONS

Coyle, "The Effects of Copper on Accelerated Life Test Performance of CdTe Solar Cells", NREL PV Module Reliability Workshop, 2012, pp. 1-6.

Gostein et al., "Light Soaking Effects on PV Modules: Overview and Literature Review", Atonometrics, Prepared for NREL PV Module Reliability Workshop, 2011, pp. 1-25.

Hossain et al., "Prospects of Znxcd1-Xs Window Layer in Cdte Thin Film Solar Cells for Numerical Analysis", 2nd International Conference on the Developments in Renewable Energy Technology (ICDRET), 2012, pp. 1-5.

Potlog et al., "The performance of thin film solar cells employing photovoltaic ZnSe/CdTe, CdS/CdTe and ZnTe/CdTe heterojunctions", 37th IEEE Photovoltaic Specialists Conference (PVSC), 2011, pp. 1-6.

Powell et al., "Research Leading to High Throughput Processing of Thin-Film CdTe PV Module", National Renewable Energy Laboratory, SR-520-35348, 2003, pp. 1-44.

Willett et al., "The Effects of Sweep Rate, Voltage Bias and Light Soaking on the Measurement of CIS-Based Solar well Characteristics," National Renewable Energy Laboratory, IEEE, 1993, pp. 495-500.

PCT International Search Report and Written Opinion, Application No. PCT/US13/75010 filed Dec. 13, 2013, dated May 13, 2014.

Chien et al., "Performance Improvement of CIGS Solar Cells with CBD-ZNS Buffer Layers By Light Soaking and Rapid Thermal Annealing" Photovoltaic Specialists Conference, 2011, pp. 1255-1258.

European Extended Search Report, Application No. EP 138630942, dated Jul. 26, 2016.

Khrypunov et al., "Recent Developments in Evaporated CdTe Solar Cells", Solar Energy Materials & Solar Cells, 2006, vol. 90, pp. 664-677.

Romeo et al., "The Role Of CdS Preparation Method In The Performance Of CdTe/CdS Thin Film Solar Cell", Proceedings of the 3rd World Conference On Photovoltaic Energy Conversion, 2003, pp. 1-2.

Romeo et al., "Comparison of different conducting oxides as substrates for CdS/CdTe thin film solar cells", Thin Solid Films, 2003, vol. 431-432, pp. 364-368.

METHODS OF FABRICATING A PHOTOVOLTAIC MODULE, AND RELATED SYSTEM

RELATED APPLICATIONS

This is a continuation application of U.S. patent application Ser. No. 13/713,697, filed under 35 U.S.C. §111(a) on Dec. 13, 2012, now U.S. Pat. No. 9,276,147. The disclosure of the aforementioned application is incorporated by reference herein in its entirety.

BACKGROUND

The invention generally relates to methods of fabricating photovoltaic modules. More particularly, the invention relates to methods of fabricating photovoltaic modules using a light-soaking step.

Thin film solar cells or photovoltaic (PV) devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. The window layer further functions to form a heterojunction (p-n junction) in combination with an absorber layer. Cadmium telluride/cadmium sulfide (CdTe/CdS) heterojunction-based photovoltaic cells are one such example of thin film solar cells, where CdS functions as the window layer.

However, thin film solar cells may have low conversion efficiencies. Thus, one of the main focuses in the field of photovoltaic devices is the improvement of conversion efficiency. Absorption of light by the window layer may be one of the phenomena limiting the conversion efficiency of a PV device. Thus, it is desirable to keep the window layer as thin as possible to help reduce optical losses by absorption. However, for most of the thin-film PV devices, if the window layer is too thin, a loss in performance can be observed due to low open circuit voltage ($V_{OC}$) and fill factor (FF).

Thus, there is a need for improved methods of fabricating photovoltaic modules. Further, there is a need for improved methods of fabricating photovoltaic modules employing a thin window layer.

BRIEF DESCRIPTION OF THE INVENTION

Embodiments of the present invention are included to meet these and other needs. One embodiment is a method. The method includes fabricating a photovoltaic module including a semiconductor assembly. The fabrication step includes performing an efficiency enhancement treatment on the semiconductor assembly, wherein the efficiency enhancement treatment includes light soaking the semiconductor assembly, and heating the semiconductor assembly. The semiconductor assembly includes a window layer having an average thickness less than about 80 nanometers, and the window layer includes cadmium and sulfur.

One embodiment is a method. The method includes fabricating a photovoltaic module including a semiconductor assembly. The fabrication step includes performing an efficiency enhancement treatment on the semiconductor assembly, wherein the efficiency enhancement treatment includes light soaking the semiconductor assembly, and heating the semiconductor assembly. The semiconductor assembly includes an absorber layer, and the absorber layer includes cadmium and tellurium.

One embodiment is a system. The system includes a lamination unit configured to laminate a back substrate and a semiconductor assembly together to form a photovoltaic module. The system further includes a conditioning unit configured to perform an efficiency enhancement treatment on the semiconductor assembly, the conditioning unit including a light source configured to irradiate light on at least a portion of semiconductor assembly.

DRAWINGS

These and other features, aspects, and advantages of the present invention will become better understood when the following detailed description is read with reference to the accompanying drawings, wherein.

DETAILED DESCRIPTION

As discussed in detail below, some of the embodiments of the invention relate to methods of fabricating a photovoltaic module. More particularly, some embodiments of the invention relate to methods of fabricating a photovoltaic module using a light-soaking step.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components (for example, a layer) being present and includes instances in which a combination of the referenced components may be present, unless the context clearly dictates otherwise.

The terms "transparent region" and "transparent layer" as used herein, refer to a region or a layer that allows an average transmission of at least 70% of incident electromagnetic radiation having a wavelength in a range from about 350 nm to about 850 nm.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. As used herein, the term "disposed on" refers to layers disposed directly in contact with each other or indirectly by having intervening layers therebetween, unless otherwise specifically indicated. The term "adjacent" as used herein means that the two layers are disposed contiguously and are in direct contact with each other.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

As discussed in detail below, some embodiments of the invention are directed to a method. The method is described with reference to FIGS. 1-4. The method includes fabricating a photovoltaic module 200, wherein the photovoltaic module 200 includes a semiconductor assembly 100. The fabrication step includes performing an efficiency enhancement treatment on the semiconductor assembly 100, wherein the efficiency enhancement step includes light soaking the semiconductor assembly 100, and heating the semiconductor assembly 100.

The terms "fabricating" or "fabrication" as used herein refer to a plurality of steps performed as a part of the photovoltaic module assembly process. The term "efficiency enhancement treatment" as used herein refers to a treatment that results in an efficiency increase of the photovoltaic device/module when compared to the un-treated device/module.

It should be noted, however, that the terms "fabricating" or "fabrication" are meant to exclude off-line characterization tests that are designed to determine the initial and/or long-term performance of the photovoltaic cell or device, such as, for example, initial efficiency measurements or degradation studies. Further, the terms "fabricating" or "fabrication" are meant to exclude off-line preconditioning treatments performed before the efficiency measurements. Thus, by way of example, the term "fabrication" or "fabricating" excludes off-line accelerated life tests that are designed to characterize the stability of the cells or modules under simulated or accelerated life test conditions.

As described in detail later, the fabrication step may include a plurality of steps employed in-line of a module assembly process, such as for example, deposition of layers, laser scribing, laminating, etching, quality-check test, efficiency-enhancement step, and the like. Further, it will be apparent to one of ordinary skill in the art that one or more of the afore-mentioned off-line characterization tests may be performed on the photovoltaic modules after the module fabrication step (including the efficiency enhancement step).

Figure 1:
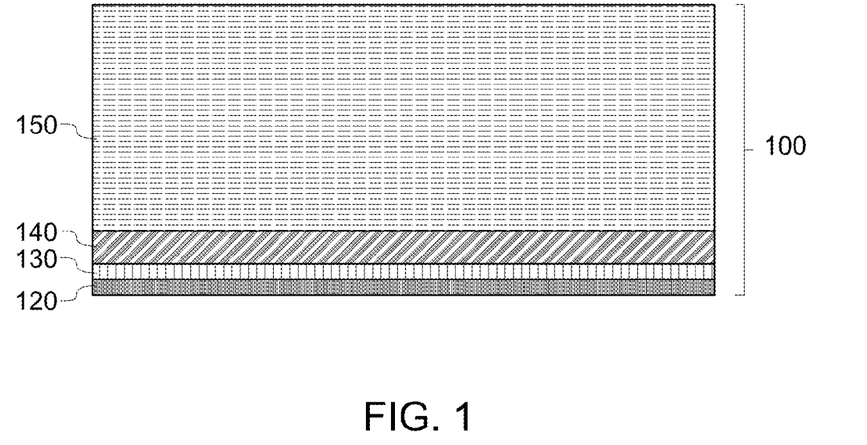
FIG. 1 is a schematic of a semiconductor assembly, according to one embodiment of the invention.

As noted earlier, the efficiency enhancement step includes light-soaking the semiconductor assembly, and heating the semiconductor assembly. The term "light-soaking" as used herein refers to exposing at least a portion of the semiconductor assembly 100 to light, under controlled conditions, for example, using a certain light intensity, for a certain length of time, and at a certain temperature. The term "light" as used herein refers to electromagnetic radiation having a wavelength in a range from about 250 nanometers to about 2500 nanometers. In some embodiments, the step of light soaking includes exposing at least a portion of the semiconductor assembly 100 to an electromagnetic radiation having wavelength in the range of solar radiation spectrum. In certain embodiments, the step of light soaking includes exposing at least a portion of the semiconductor assembly 100 to an electromagnetic radiation having a wavelength in a range from about 200 nanometers to about 900 nanometers.

As mentioned earlier, the light-soaking step may be further characterized by the light intensity. In some embodiments, the light-soaking step includes exposing at least a portion of the semiconductor assembly 100 to a light intensity in a range from about 0.01 Sun to about 10 Sun. In some embodiments, the light-soaking step includes exposing at least a portion of the semiconductor assembly 100 to a light intensity in a range from about 0.1 Sun to about 5 Sun. In some embodiments, the light-soaking step includes exposing at least a portion of the semiconductor assembly 100 to a light intensity in a range from 0.2 Sun to about 0.9 Sun. 1 sun is typically defined as the nominal full sunlight intensity on a bright clear day on Earth, which approximates to 1000 $W/m^2$.

In certain embodiments, the light-soaking step is effected under open-circuit conditions. The term "open-circuit conditions" as used herein means that the light-soaking step is effected in the absence of an external voltage bias across the semiconductor assembly.

In some embodiments, the efficiency enhancement step further includes heating the semiconductor assembly 100 at a temperature sufficient to result in a photovoltaic device having the desired electrical and optical properties. In some embodiments, the efficiency enhancement step includes heating the semiconductor assembly 100 at a temperature greater than 65° C. In some embodiments, the efficiency enhancement step includes heating the semiconductor assembly 100 at a temperature greater than 105° C. In some embodiments, the efficiency enhancement step includes heating the semiconductor assembly 100 at a temperature in a range from about 105° C. to about 200° C. In some embodiments, the semiconductor assembly 100 may be heated to the desired temperature, such as in a furnace or oven, or through the use of a heat lamp, laser, or other source of heat.

The semiconductor assembly 100 is generally maintained or "held" at a temperature within the desired range for a desired time. In some embodiments, the efficiency enhancement step is performed for a time duration less than about 100 hours. In some embodiments, the efficiency enhancement step is performed for a time duration less than about 50 hours. In some embodiments, the efficiency enhancement step is performed for a time duration less than about 20 hours. In some embodiments, the efficiency enhancement step is performed for a time duration less than about 10 hours. In some embodiments, the efficiency enhancement step is performed for a time duration in a range from about 15 minutes to about 1 hour. In certain embodiments, the efficiency enhancement step is performed for a time duration equal to or less than the time duration required for the lamination step (described in detail later). Those skilled in the art will appreciate that the time desired to effect the efficiency enhancement step depends in part on the selected heating temperature, with longer times generally used for lower temperatures.

In some embodiments, the light-soaking and the heating steps are effected sequentially. In such instances, for example, the light soaking step may be effected first followed by the heating step, or vice versa. Further, in such instances, the light-soaking step may also include a first heating step, including heating the semiconductor assembly to a lower temperature (for example, temperature less than 105° C.), such that the light soaking is effected. This may be followed by the second heating step that includes heating the semiconductor assembly to a higher temperature (for example, temperature greater than 105° C.). Further, in such instances, the duration of light-soaking step and the heating step may be the same or different. In some embodiments, the light-soaking step and the heating step may have some overlap, such that for a certain duration, the light-soaking step and the heating step may be effected simultaneously.

In certain embodiments, the light-soaking and heating steps are affected simultaneously. In such instances, the efficiency enhancement step may be effected by light soaking at least a portion of the semiconductor assembly 100, while simultaneously heating the semiconductor assembly 100, for a certain period of time.

As noted earlier, the photovoltaic module 200 includes a semiconductor assembly 100. The term "semiconductor assembly" as used herein refers to an assembly of one or more layers, wherein at least one of the layers includes a semiconductor layer. The term "semiconductor layer" as used herein refers to a layer including a semiconductor material. As indicated, for example, in FIGS. 1-4, the semiconductor assembly 100 includes a transparent conductive layer 120, a window layer 140 disposed on the transparent conductive layer, and an absorber layer 150 disposed on the window layer 140. In some embodiments, the semiconductor assembly 100 may further include one or more additional layers (e.g., a buffer layer 130 or a back contact layer 180), as indicated in FIGS. 1-4. The terms "semiconductor assembly" and "assembly" may be used herein interchangeably.

As is well known to one of ordinary skill in the art, a photovoltaic module 200 typically includes a plurality of individual cells that may be defined by scribe lines formed in the various layers of the semiconductor assembly 100. As will be appreciated by one of ordinary skill in the art, in such instances, the semiconductor assembly 100 may further include one or more scribe lines (not shown).

Figure 2:
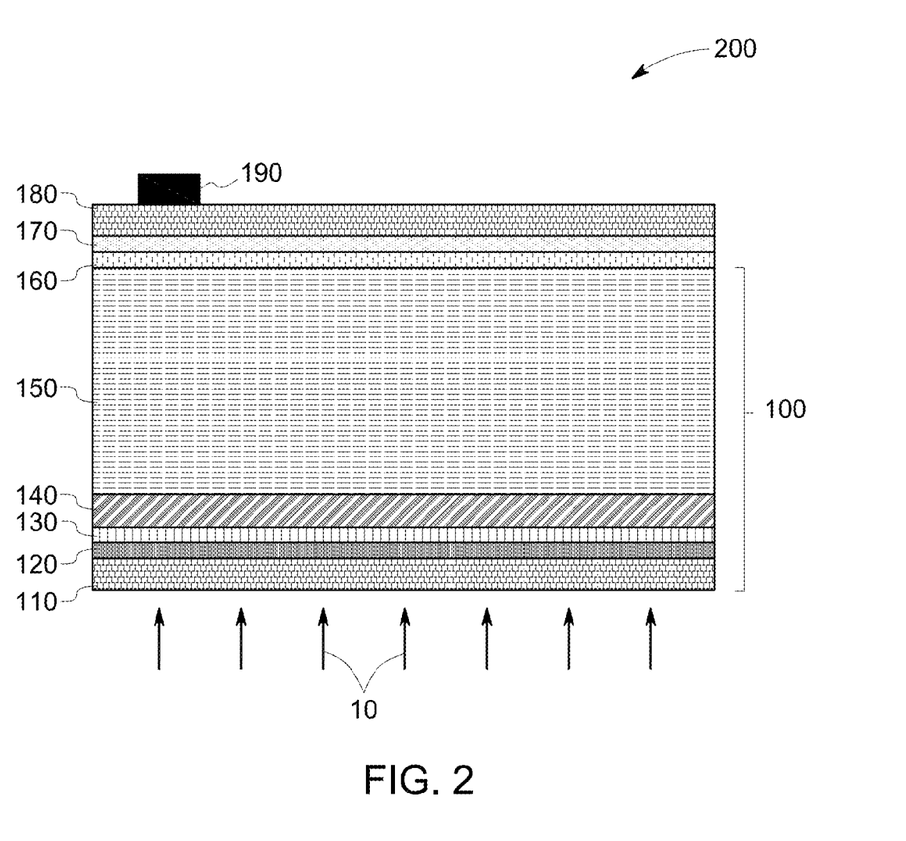
FIG. 2 is a schematic of a photovoltaic module, according to one embodiment of the invention.
Figure 3:
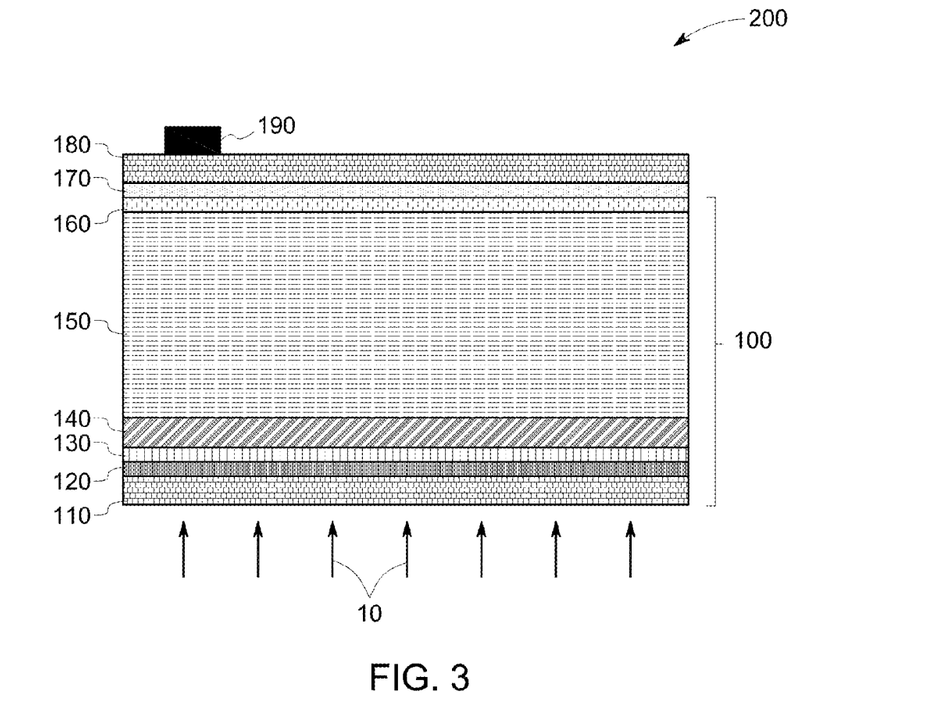
FIG. 3 is a schematic of a photovoltaic module, according to one embodiment of the invention.

The photovoltaic module 200 may further include a "superstrate" or a "substrate" configuration of layers. In some embodiments, a method of fabricating a photovoltaic module 200 including a "superstrate" configuration of layers is presented. In such instances, as indicated in FIGS. 2 and 3, the photovoltaic module 200 includes a plurality of layers, for example, a support 110, a transparent conductive layer 120 disposed on the support 110, a buffer layer 130 disposed on the transparent conductive layer 120, a window layer 140 disposed on the buffer layer 130, an absorber layer 150 disposed on the window layer 140, and a back contact layer 160 disposed on the absorber layer 150. In some embodiments, the module 200 may further include one or more intervening layers, for example, a barrier layer between the support 110 and the transparent conductive layer 120, or a p+-type semiconductor layer between the absorber layer 150 and the back contact layer 160 (embodiments not shown). In some embodiments the various layers may further include a plurality of layers, e.g., the buffer layer 130 may include two separate layers, acting as a buffer layer together. Similarly, the back contact layer 160 may include a plurality of layers that may together function as the back contact.

As illustrated in FIGS. 2 and 3, in such embodiments, the solar radiation 10 enters from the support 110, and after passing through the transparent conductive layer 120 and the window layer 140, enters the absorber layer 150, where the conversion of electromagnetic energy of incident light (for instance, sunlight) to electron-hole pairs (that is, to free electrical charge) occurs.

Figure 4:
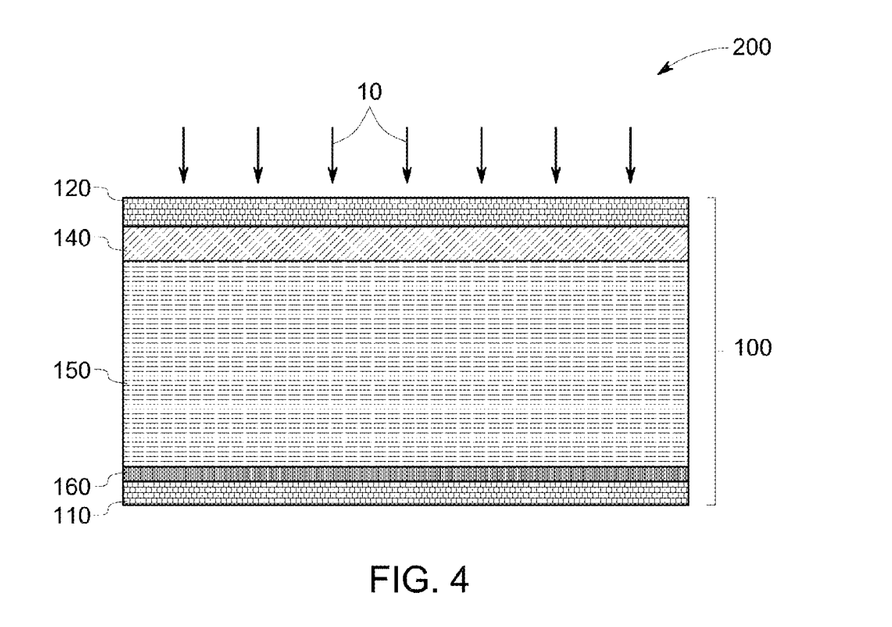
FIG. 4 is a schematic of a photovoltaic module, according to one embodiment of the invention.

In alternative embodiments, as illustrated in FIG. 4, a method of fabricating a photovoltaic module 200 including a "substrate" configuration is presented. In such instances, the photovoltaic module 200 includes a back contact layer 160 disposed on a support 110. Further, the absorber layer 150 is disposed on the back contact layer 160, and the window layer 140 is disposed on the absorber layer 150. A transparent conductive layer 120 is further disposed on the window layer 140.

As illustrated in FIG. 4, in such embodiments, the solar radiation 10 enters from the transparent conductive layer 120 and after passing through the window layer 140, enters the second absorber layer 150, where the conversion of electromagnetic energy of incident light (for instance, sunlight) to electron-hole pairs (that is, to free electrical charge) occurs.

In some embodiments, the support 110 is transparent over the range of wavelengths for which transmission through the support 110 is desired. In one embodiment, the support 110 may be transparent to visible light having a wavelength in a range from about 350 nm to about 1000 nm. In some embodiments, the support 110 includes a material capable of withstanding heat treatment temperatures greater than about 600° C., such as, for example, silica or borosilicate glass. In some other embodiments, the support 110 includes a material that has a softening temperature lower than 600° C., such as, for example, soda-lime glass or a polyimide. In some embodiments certain other layers may be disposed between the transparent conductive layer 120 and the support 110, such as, for example, an anti-reflective layer or a barrier layer (not shown).

In some embodiments, the transparent conductive layer 110 includes a transparent conductive oxide (TCO). Non-limiting examples of transparent conductive oxides include cadmium tin oxide (CTO), indium tin oxide (ITO), fluorine-doped tin oxide (SnO:F or FTO), indium-doped cadmium-oxide, cadmium stannate ($Cd_2SnO_4$ or CTO), doped zinc oxide (ZnO), such as aluminum-doped zinc-oxide (ZnO:Al or AZO), indium-zinc oxide (IZO), and zinc tin oxide ($ZnSnO_x$), or combinations thereof. Depending on the specific TCO employed and on its sheet resistance, the thickness of the transparent conductive layer 120 may be in a range of from about 50 nm to about 600 nm, in one embodiment.

In some embodiments, the window layer 140 is disposed directly on the transparent conductive layer 120 (embodiment not shown). In alternate embodiments, the semiconductor assembly 100 includes an additional buffer layer 130 interposed between the transparent conductive layer 120 and the window layer 140, as indicated in FIG. 2. In some embodiments, the thickness of the buffer layer 130 is in a range from about 50 nm to about 200 nm. Non-limiting examples of suitable materials for the buffer layer 130 include tin dioxide ($SnO_2$), zinc tin oxide (zinc-stannate (ZTO)), zinc-doped tin oxide ($SnO_2$:Zn), zinc oxide (ZnO), indium oxide ($In_2O_3$), cadmium magnesium oxide (CdMgO), zinc magnesium oxide (ZnMgO), or combinations thereof. As noted earlier, in some embodiments, a plurality of layers may together function as the buffer layer 130.

The term "window layer" as used herein refers to a semiconducting layer that is substantially transparent, and disposed between the transparent conductive layer 120 and the absorber layer 150. In some embodiments, the window layer 140 may be disposed adjacent to the absorber layer 150. In some other embodiments, an interlayer (not shown) may be disposed between the window layer 140 and the absorber layer 150. The term "absorber layer" as used herein refers to a semiconducting layer wherein the solar radiation is absorbed.

In some embodiments, the window layer 140 may form a heterojunction with the absorber layer 150. In some embodiments, the window layer 140 may be doped with an n-type dopant and the absorber layer 150 may be doped with a p-type dopant to form a heterojunction. In some other embodiments, the window layer 140 may be doped with a p-type dopant and the absorber layer 150 may be doped with an n-type dopant to form a heterojunction. As used in this context, a heterojunction is a semiconductor junction that is composed of layers of dissimilar semiconductor material. These materials usually have non-equal band gaps. As an example, a heterojunction can be formed by contact between a layer or region of one conductivity type with a layer or region of opposite conductivity, e.g., a "p-n" junction.

In some embodiments, the window layer 140 includes an n-type semiconductor material. In such instances, the absorber layer 150 may be doped to be p-type and the window layer 140 and the absorber layer 150 may form an "n-p" heterojunction. In some embodiments, the window layer 140 may be doped to be n-type and the absorber layer 150 may be doped such that it effectively forms an n-i-p configuration, using a p+-semiconductor layer on the backside of the absorber layer. In some other embodiments, the absorber layer 150 may be doped such that it has an intrinsic-type region near the front interface and a p-type region near the back interface, effectively forming an n-i-p configuration.

In some embodiments, the window layer 140 includes cadmium and sulfur. In some embodiments, the window layer 140 includes cadmium and selenium. Non-limiting exemplary materials for the window layer 140 include cadmium sulfide (CdS), cadmium zinc sulfide (CdZnS), oxygenated cadmium sulfide (CdS:O), or combinations thereof. In certain embodiments, the window layer 140 includes cadmium sulfide (CdS). In certain embodiments, the window layer 140 includes oxygenated cadmium sulfide (CdS:O).

In some embodiments, the window layer 140 may include a discontinuous layer. In certain embodiments, the window layer may include a discontinuous layer, allowing areas in cross-section where absorber layer 150 is in direct contact with the underlying layer, e.g., the buffer layer 130. In such instances, the window layer may be characterized by a variable thickness.

In some embodiments, the window layer 140 has an average thickness less than about 80 nanometers. In some embodiments, the window layer 140 has an average thickness less than about 70 nanometers. In some embodiments, the window layer 140 has an average thickness less than about 60 nanometers. In some embodiments, the window layer 140 has an average thickness in a range from about 1 nanometer to about 50 nanometers. In some embodiments, the window layer 140 has an average thickness in a range from about 10 nanometers to about 40 nanometers.

As noted, the window layer 140 may be discontinuous in cross-section. In such embodiments, a maximum thickness of the window layer 140 may be about 80 nanometers. In some embodiments, a maximum thickness of the window layer 140 may be about 70 nanometers. In some embodiments, a maximum thickness of the window layer 140 may be about 60 nanometers.

In certain embodiments, the window layer 140 may be further characterized by percentage of area where the absorber layer 150 is in contact with the underlying layer (e.g., the buffer layer 130). In some embodiments, the percentage of area where the absorber layer 150 is in contact with the underlying layer is greater than about 1-percent of the total cross-section area of the window layer 140. In some embodiments, the percentage of area where the absorber layer 150 is in contact with the underlying layer is in a range from about 10 percent to about 90 percent, from about 20 percent to about 80 percent, or from about 30 percent to about 70 percent, of the total cross-section area of the window layer 140.

As noted earlier, the thickness of the window layer 140 is typically desired to be minimized in a photovoltaic device to reduce optical losses due to absorption, and achieve higher efficiencies. Accordingly, it is believed that with the use of fabricating methods of the present invention, the thickness of the window layer 140 (e.g., CdS layer) may be desirably reduced, while improving the performance (higher $J_{SC}$ while maintaining $V_{OC}$ and FF) of the resulting photovoltaic device. Moreover, the photovoltaic device may achieve a reduction in cost of production because of the use of lower amounts of CdS.

Without being bound by any theory, it is believed that during the light-soaking treatment, the weak-diodes associated with the junction between the buffer layer 130 and the absorber layer 150 may be cured, such that both the fill factor (FF) and the open-circuit voltage (Voc) of the device improves. This may be especially desirable when the window layer 140 is thin enough such that there are areas where the absorber layer 150 touches the buffer layer 130.

In some embodiments, a photoactive material is used for forming the absorber layer 150. Suitable photo-active materials include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), or combinations thereof. In some embodiments, a suitable photo-active material includes copper indium disulfide (CIS), copper indium diselenide (CISe), copper indium gallium sulfide (CIGS), copper indium gallium diselenide (CIGSe), copper indium gallium sulfur selenium (CIGSSe), copper indium gallium aluminum sulfur selenium ($Cu(In,Ga,Al)(S,Se)_2$), copper zinc tin sulfide (CZTS), or combinations thereof. The above-mentioned photo-active semiconductor materials may be used alone or in combination. Further, these materials may be present in more than one layer, each layer having different type of photo-active material or having combinations of the materials in separate layers. In certain embodiments, the absorber layer 150 includes cadmium telluride (CdTe). In certain embodiments, the absorber layer 150 includes p-type cadmium telluride (CdTe).

In some embodiments, the absorber layer 150 may further include a group IB element as a dopant, for example, copper, silver, gold, or combinations thereof. In certain embodiments, the absorber layer may further include copper. In some embodiments, the atomic concentration of copper in the absorber layer 150 may be compositionally graded across the thickness of the absorber layer 150.

In some embodiments, the window layer 140, the absorber layer 150, or both the layers may contain oxygen. Without being bound by any theory, it is believed that the introduction of oxygen to the window layer 140 (e.g., the CdS layer) may result in improved device performance. In some embodiments, the amount of oxygen is less than about 20 atomic percent. In some embodiments, the amount of oxygen is between about 1 atomic percent to about 10 atomic percent. In some embodiments, for example, in the absorber layer 150, the amount of oxygen is less than about 1 atomic percent. Moreover, the oxygen concentration within the window layer 140, the absorber layer 150, or both the layers may be substantially constant, or, alternatively compositionally graded across the thickness of the respective layer.

In some embodiments, the semiconductor assembly 100 may further include a p+-type semiconductor region formed in the absorber layer 150 (near the back interface). In some embodiments, the semiconductor assembly 100 may further include a p+-type semiconductor layer disposed on the absorber layer 150. The term "p+-type semiconductor layer" or "p+-type semiconductor region" as used herein refers to a semiconductor layer or region having an excess mobile p-type carrier or hole density compared to the p-type charge carrier or hole density in the absorber layer 150.

In one embodiment, the p+-type semiconductor layer/region includes a heavily doped p-type material including amorphous Si:H, amorphous SiC:H, crystalline Si, microcrystalline Si:H, microcrystalline SiGe:H, amorphous SiGe: H, amorphous Ge, microcrystalline Ge, GaAs, BaCuSF, BaCuSeF, BaCuTeF, LaCuOS, LaCuOSe, LaCuOTe, LaSrCuOS, LaCuOSe$_{0.6}$Te$_{0.4}$, BiCuOSe, BiCaCuOSe, PrCuOSe, NdCuOS, Sr$_2$Cu$_2$ZnO$_2$S$_2$, Sr$_2$CuGaO$_3$S, (Zn,Co,Ni)O$_x$, or combinations thereof. In another embodiment, the p+-type semiconductor layer/region includes a p+-doped material including zinc telluride, magnesium telluride, manganese telluride, beryllium telluride, mercury telluride, arsenic telluride, antimony telluride, copper telluride, or combinations thereof. In some embodiments, the p+-doped material further includes a dopant including copper, gold, nitrogen, phosphorus, antimony, arsenic, silver, bismuth, sulfur, sodium, or combinations thereof.

In some embodiments, the photovoltaic module 200 further includes a back contact layer 160, as indicated in FIGS. 2 and 3. In some embodiments, the back contact layer 160 is disposed directly on the absorber layer 150, as indicated in FIGS. 2 and 3. In some embodiments, the back contact layer 160 includes gold, platinum, molybdenum, tungsten, tantalum, titanium, palladium, aluminum, chromium, nickel, silver, graphite, or combinations thereof. As noted earlier, the back contact layer 160 may include a plurality of layers that function together as the back contact.

In some embodiments, another metal layer (not shown), for example, aluminum, may be disposed on the metal layer 160 to provide lateral conduction to the outside circuit. In certain embodiments, a plurality of metal layers (not shown), for example, aluminum and chromium, may be disposed on the back contact layer 160 to provide lateral conduction to the outside circuit. In certain embodiments, the back contact layer 160 may include a layer of carbon, such as, graphite deposited on the absorber layer 150, followed by one or more layers of metal, such as the metals described above.

Referring again to FIGS. 2 and 3, in some embodiments, the photovoltaic module 200 further includes a back substrate 180 disposed on the back contact layer 160. An optional intervening layer 170 (for example, an encapsulant layer) may be further disposed between the back substrate 180 and the back contact layer 160. The back substrate 180 may function to encapsulate the photovoltaic module 200, and may be designed to seal and protect the module 200 from the environment.

In some embodiments, other components (not shown) may be included in the exemplary photovoltaic module 200, such as, buss bars, external wiring, laser scribes, etc., in order to achieve a desired voltage, such as through an electrical wiring connection. Each end of the series connected cells may be attached to a suitable conductor such as a wire or bus bar, to direct the generated current to convenient locations for connection to a device or other system using the generated current.

The photovoltaic module, as indicated in FIGS. 2 and 3 may further include a junction box 190 electrically coupled to the semiconductor assembly 100 via one or both of a bus bar (for example, a bus tape) and a bus bar connector (for example, a foil connector). A bus bar connector may, for example, connect the bus bars to the junction box 190, which includes leads for connecting the module 200 to a load, other junction boxes, other modules 200, a grid, and so forth. In some embodiments, the photovoltaic module 200 may further include a suitable packaging component, such that the module 200 may be stored or shipped.

As will be apparent to one of ordinary skill in the art, the fabrication method for the module 200 may include a plurality of steps, and the efficiency enhancement step may be effected during one or more of the module fabricating steps. Further, the sequence of disposing the layers, and the efficiency enhancement step may depend on a desirable configuration, for example, "substrate" or "superstrate" configuration of the module.

In certain embodiments, a method for fabricating a photovoltaic module 200 in a superstrate configuration is described. In some embodiments, the semiconductor assembly 100 may be pre-fabricated. In alternative embodiments, the method may further include the step(s) of fabricating the semiconductor assembly 100. In such instances, the method may further include the step(s) of disposing one or more layers, prior to the efficiency enhancement step.

Referring again to FIGS. 2 and 3, in some embodiments, the method may further include the step of disposing a transparent conductive layer 120 on a support 110 by any suitable technique, such as sputtering, chemical vapor deposition, spin coating, spray coating, or dip coating. An optional buffer layer 130 may be further deposited on the transparent conductive layer 120 using sputtering. The method may further include the step of disposing a window layer 140 on the transparent conductive layer 120. Non-limiting examples of the deposition methods for the window layer 140 include one or more of close-space sublimation (CSS), vapor transport deposition (VTD), sputtering (for example, direct current pulse sputtering (DCP), electrochemical deposition (ECD), and chemical bath deposition (CBD).

The method may further include the step of disposing the absorber layer 150 on the window layer 140. In some embodiments, the absorber layer 150 may be deposited using a suitable method, such as, close-space sublimation (CSS), vapor transport deposition (VTD), ion-assisted physical vapor deposition (IAPVD), radio frequency or pulsed magnetron sputtering (RFS or PMS), plasma enhanced chemical vapor deposition (PECVD), or electrochemical deposition (ECD).

In some embodiments, a series of post-forming treatments may be further applied to the exposed surface of the absorber layer 150. These treatments may tailor the functionality of the absorber layer 150 and prepare its surface for subsequent adhesion to the back contact layer(s) 160. For example, the absorber layer 150 may be annealed at elevated temperatures for a sufficient time to create a quality p-type layer. Further, the absorber layer 150 may be treated with a passivating agent (e.g., cadmium chloride) and a tellurium-enriching agent (for example, iodine or an iodide) to form a tellurium-rich region in the absorber layer 150. Additionally, copper may be added to the absorber layer 150 in order to obtain a low-resistance electrical contact between the absorber layer and a back contact layer(s) 160.

In some embodiments, a p+-type semiconducting layer (not shown) may be further disposed on the absorber layer 150 by depositing a p+-type material using any suitable technique, for example PECVD or sputtering. In an alternate embodiment, as mentioned earlier, a p+-type semiconductor region may be formed in the absorber layer 150 by chemically treating the absorber layer 150 to increase the carrier density on the back-side (side in contact with the metal layer and opposite to the window layer) of the absorber layer 150 (for example, using iodine and copper). In some embodiments, a back contact layer 160, for example, a graphite layer may be deposited on the p+-type semiconductor layer (embodiment not shown), or directly on the absorber layer 150. A plurality of metal layers may be further deposited on the back contact layer 160.

As will be appreciated by one of ordinary skill in the art, the photovoltaic module 200 may be further completed by one or more additional steps. In some embodiments, a laser may be used to scribe the deposited layers of the semiconductor assembly 100 to define and isolate individual cells, to define a perimeter edge zone around the cells, and to electrically connect the plurality of cells. The method may further include the step of incorporating a dielectric material in one or more of the scribe lines, before the application of the back contact layer 160.

As noted earlier, the method further includes an efficiency enhancement step. In certain embodiments, the efficiency enhancement step may be effected simultaneously with, or, after the last high temperature treatment step employed in the photovoltaic module fabrication process.

Referring now to FIG. 2, in some embodiments, the efficiency enhancement step is effected prior to the step of disposing the back contact layer 160. In such instances, the semiconductor assembly 100 may include a support 110, a transparent conductive layer 120 disposed on the support 110, a buffer layer 130 disposed on the transparent conductive layer 120, a window layer 140 disposed on the buffer layer 130, and an absorber layer 150 disposed on the window layer 140, as illustrated in FIG. 2. In such instances, for example, the efficiency enhancement step may be effected simultaneously with or after the copper-treatment step. In such instances, after the step of efficiency enhancement, the photovoltaic module 200 may be completed by disposing the back contact layer 160 on the absorber layer 150.

In certain embodiments, the efficiency enhancement step may be effected simultaneously with the step of disposing the back contact layer 160. In certain embodiments, the efficiency enhancement step may be effected simultaneously with the step of graphite deposition and/or post-graphite deposition anneal.

In some other embodiments, the efficiency enhancement step is effected after the step of disposing the back contact layer 160. In such instances, the semiconductor assembly 100 may include a support 110, a transparent conductive layer 120 disposed on the support 110, a buffer layer 130 disposed on the transparent conductive layer 120, a window layer 140 disposed on the buffer layer 130, an absorber layer 150 disposed on the window layer 140, and a back contact layer 160 disposed on the absorber layer 150, as illustrated in FIG. 3.

In certain embodiments, the method of fabricating a photovoltaic module may further include a lamination step, which includes disposing a back substrate 180 (for example, an encapsulant glass) on the back contact layer 160. The lamination step may further include the steps of aligning, heating, and bonding together of two or more layers in the photovoltaic module 200. The lamination step encapsulates the various layers of the photovoltaic module 200, thereby sealing the photovoltaic device from the environment. In some embodiments, the efficiency enhancement step may be effected before the lamination step.

In some embodiments, the efficiency enhancement step may be effected after the lamination step. In such instances, for example, the semiconductor assembly 100 may be first laminated with the back substrate 180 by heating the semiconductor assembly 100. During the lamination step, the semiconductor assembly 100 may be heated to a temperature in a range from 100° C. to 200° C. This may be followed by the efficiency enhancement step including light soaking, and heating at a temperature greater than 105° C. In such instances, after the lamination step, the temperature of the semiconductor assembly 100, may be ramped down, ramped up, or maintained such that the desired processing temperature is achieved.

In certain embodiments, the efficiency enhancement step may be effected simultaneously with the lamination step. Light soaking of the photovoltaic device may take place before, after, or during heating of the lamination cycle. The time duration of the light soaking step may be longer or shorter than that of heating step of the lamination cycle. Typical lamination temperature is in a range from 100° C. to 200° C., and a typical time duration of lamination is in a range from about 5 minutes to about 20 minutes. In certain embodiments, the lamination step may include heating the semiconductor assembly 100 to a temperature greater than 105° C.

In certain embodiments, the method may include the steps of lamination and efficiency enhancement during a single temperature cycle through the exposure to the light source, during the temperature cycle of the lamination. In such instances, the time duration of the light soaking step may be substantially the same as that of heating step of the lamination cycle. Without being bound by any theory, it is believed that by combining the lamination and the efficiency enhancement steps, the number of manufacture steps, the energy usage during the two steps, as well as the floor space may be desirably reduced, thereby reducing the cost of production.

In some embodiments, the method may further include the step of electrically coupling a junction-box 190 to the photovoltaic module 200. In some instances, the efficiency enhancement step may be effected prior to the step of coupling the junction-box 190. In some other instances, efficiency enhancement step may be effected after the step of coupling the junction-box 190. In some embodiments, the method may further include the step of packaging the photovoltaic module 200, such that the module is ready to be stored or shipped.

Figure 5:
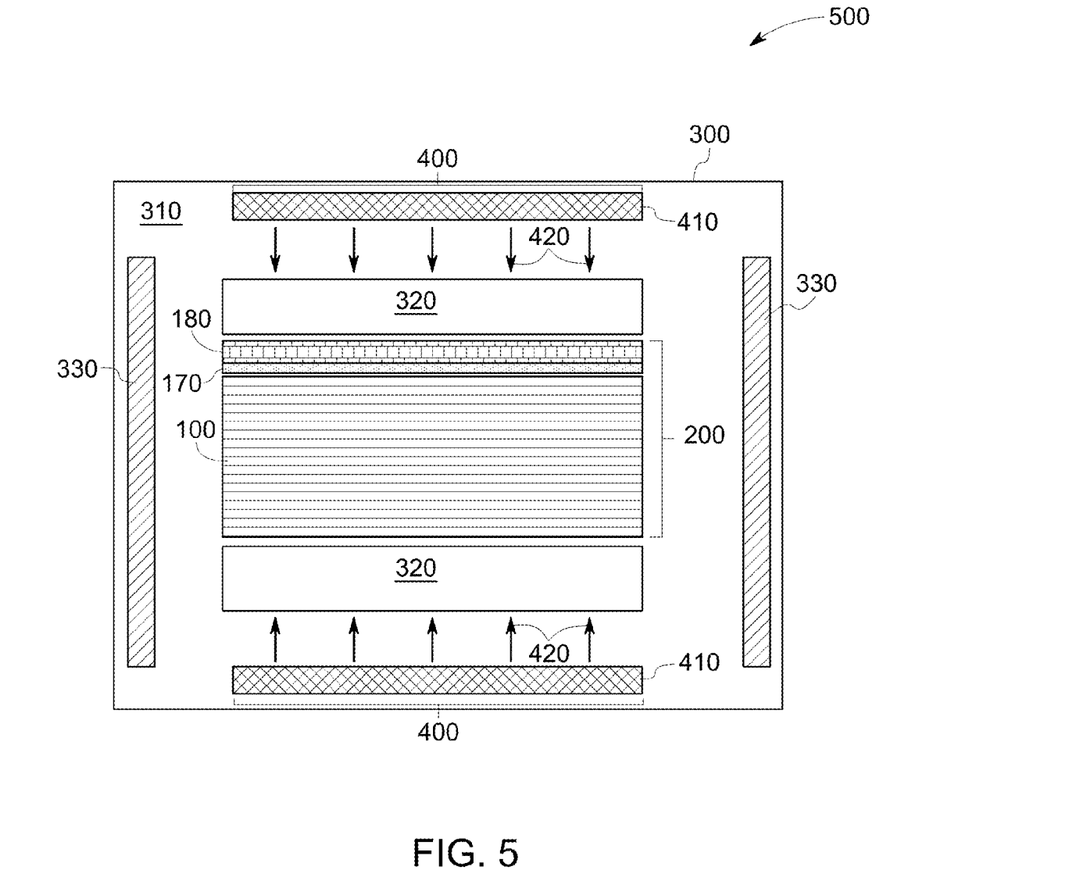
FIG. 5 is a schematic of a system for processing a photovoltaic module, according to one embodiment of the invention.
Figure 6:
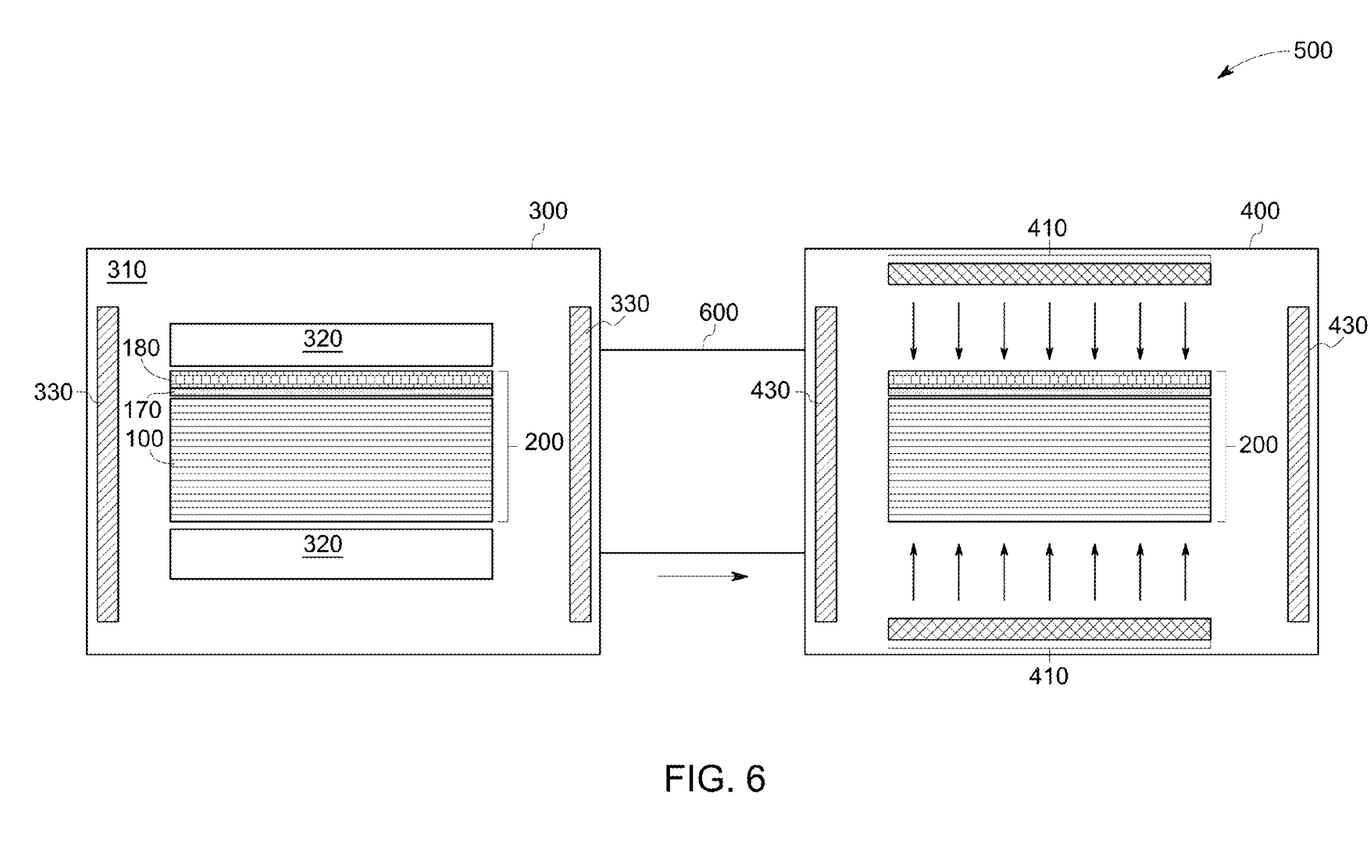
FIG. 6 is a schematic of a system for processing a photovoltaic module, according to one embodiment of the invention.

Referring now to FIGS. 5 and 6, a system 500 for fabricating a photovoltaic module 200 is presented. The system 500 includes a lamination unit 300 configured to laminate a back substrate 180 and a semiconductor assembly 100 together to form a photovoltaic module 200, as indicated in FIGS. 5 and 6. The lamination unit 300 further includes a lamination chamber 310, and a lamination press including a plurality of lamination plates 320 disposed in the lamination chamber 310. As further indicated, in FIGS. 5 and 6, the semiconductor assembly 100 is disposed between the lamination plates 320. The semiconductor assembly further includes a plurality of layers, as described earlier. The lamination chamber 310 further includes a back substrate 180 and an optional intervening layer 170 disposed on the semiconductor assembly 100.

As noted earlier, the lamination plates 320 in the lamination unit 300 may be configured to press and bond the back substrate 180 to the semiconductor assembly 100 to form the photovoltaic module 200. The lamination unit may further include one or more heating units 330 configured to heat the semiconductor assembly 110 during the lamination step. The heating unit(s) may be placed inside the lamination chamber 310 or outside the lamination chamber 310. Further, the heating unit(s) 330 may be positioned on the top, on the bottom, or to the side(s) of the semiconductor assembly 110. In an exemplary embodiment of FIG. 5, the heating unit(s) are depicted as being positioned to the sides of the semiconductor assembly 100. In some embodiments, the lamination unit 300 may further include a heating unit 330 configured to heat the photovoltaic module at a temperature in a range from 100° C. to 200° C.

The system 500 further includes a conditioning unit 400 configured to thermally process the photovoltaic module 200. The conditioning unit 400 further includes a light source 410 configured to irradiate light on at least a portion of the photovoltaic module 200, as indicated in FIGS. 5 and 6. The light source 410 may be positioned on the top, on the bottom, or to the side(s) of the photovoltaic module 200. In an exemplary embodiment of FIGS. 5 and 6, the light source(s) 410 is depicted as being positioned on the top and at the bottom of the photovoltaic module 200.

As noted earlier, in certain embodiments, the lamination step and the efficiency enhancement step may be effected simultaneously. In such instances, as indicated in FIG. 5, the conditioning unit 400 may be configured such that the efficiency enhancement step is effected simultaneously with the lamination step in the lamination unit 300.

In such embodiments, the light 420 may be irradiated from the top or the bottom of the semiconductor assembly 100, or irradiated from the sides and directed through total internal reflection and/or fiber optics. In certain embodiments, a transparent plate 320 may be used for the lamination unit, and light may be irradiated through the plate 320. Further, in such instances, the heating unit(s) 330 in the lamination unit 300 may be further configured to heat the photovoltaic module 200 during the efficiency enhancement step.

In alternate embodiments, the lamination step and the efficiency enhancement step may be effected sequentially. In such instances, as indicated in FIG. 6, the conditioning unit 400 may be configured such that the efficiency enhancement step is effected after the lamination step in the lamination unit 300. As indicated in FIG. 5, in such embodiments, the system 500 may further include a conveying unit 600 configured to transport the photovoltaic module 200 from the lamination unit 300 to the conditioning unit 400. The conditioning unit 400 may further include a light source 410, as mentioned earlier, and the light 420 may be irradiated either from the top or from the bottom of the photovoltaic module 200, or irradiated through the sides and directed through total internal reflection and/or fiber optics.

In some embodiments, the conditioning unit 400 may further include a heating unit 430 configured to heat the photovoltaic module 200 at a temperature greater than 65° C. In some embodiments, the conditioning unit 400 may further include a heating unit 430 configured to heat the photovoltaic module 200 at a temperature greater than 105° C. In such instances, the heating unit(s) 330 in the lamination unit 300 may be configured to heat the semiconductor assembly 100 to a lamination temperature, for example, in a range from 100° C. to 200° C. The heating unit(s) 430 in the conditioning unit 400 may be further configured such that, after the lamination step, the temperature of the photovoltaic module 200 may be ramped down, ramped up, or maintained such that the desired processing temperature may be achieved.

EXAMPLES

Comparative Example 1

Method of Fabricating a Cadmium Telluride Photovoltaic Device, without Light Soaking A cadmium telluride photovoltaic device was made by depositing several layers on a cadmium tin oxide (CTO) transparent conductive oxide (TCO)-coated substrate. The substrate was a 1.4 millimeters thick PVN++ glass, which was coated with a CTO transparent conductive layer and a thin high resistance transparent zinc tin oxide (ZTO) buffer layer. The window layer containing cadmium sulfide (CdS:O, 5 molar % oxygen in the CdS layer) having a thickness deposited in the range of about 40 nanometers to about 90 nanometers was then deposited on the ZTO layer by DC sputtering followed by deposition of cadmium telluride (CdTe) layer at 550° C., and back contact formation.

Example 1

Method of Fabricating a Cadmium Telluride Photovoltaic Device Using a Light Soaking Step The method of making the photovoltaic device was similar to the Comparative Example 1, except after the step of back contact formation, the device was loaded into an accelerated lifetime conditioning chamber, and subjected to light-soaking at 125° C. using 1 Sun light intensity for 5 hours, under open-circuit conditions.

Figure 7:
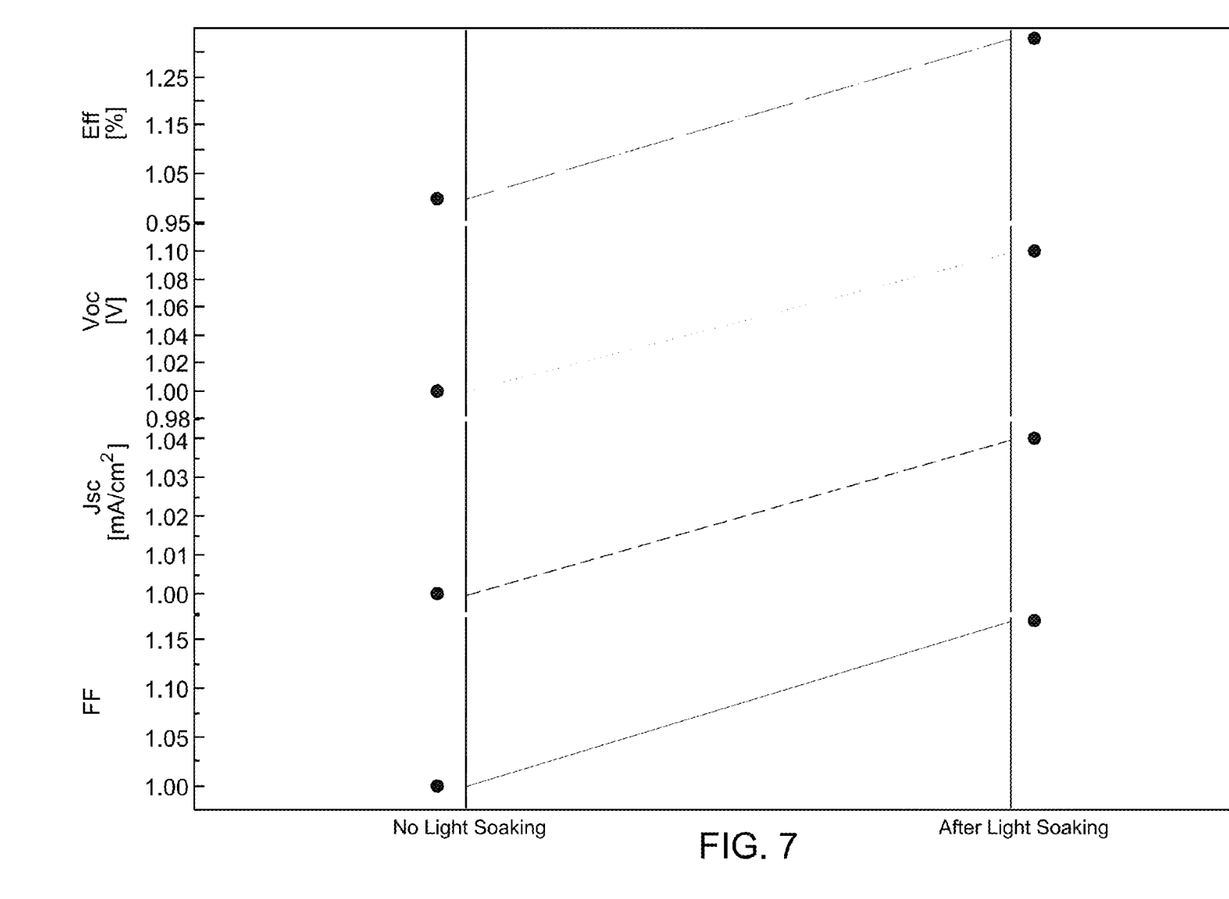
FIG. 7 shows the normalized performance parameters for devices subjected to the light-soaking treatment versus the un-treated photovoltaic devices.
Figure 8:
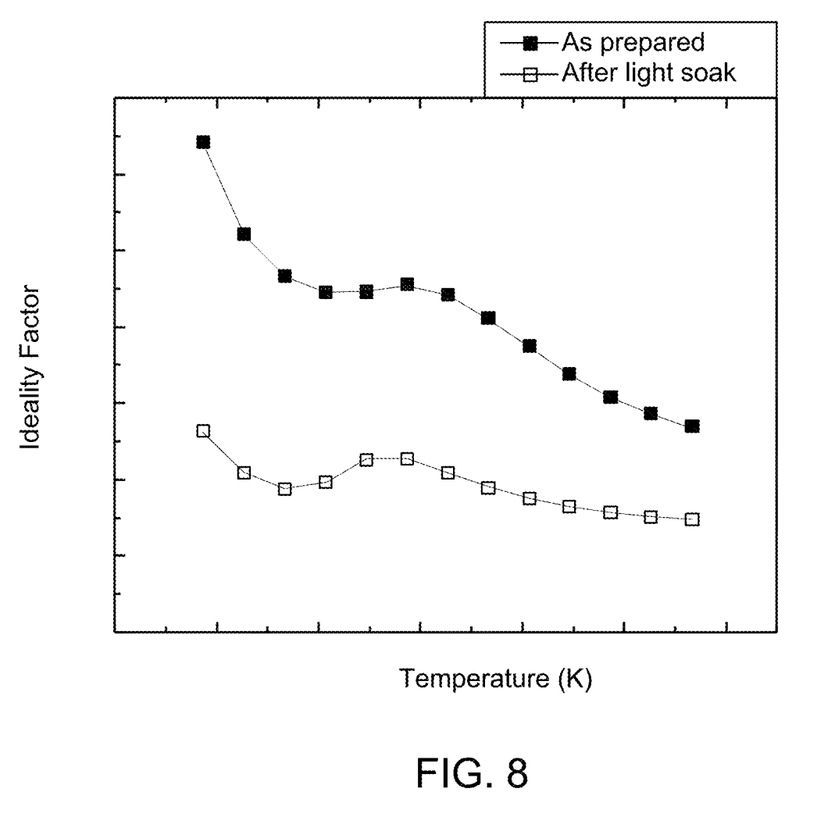
FIG. 8 shows the ideality factor curves for un-treated photovoltaic devices and devices subjected to the light-soaking treatment.

FIG. 7 shows the normalized (with respect to Comparative Example 1) performance parameters, such as, efficiency, open circuit voltage (VOC), short-circuit current (JSC), and fill factor (FF) for Example 1 (device subjected to light-soaking) and Comparative Example 1 (device not subjected to light-soaking). As illustrated in FIG. 7, Example 1 showed improved performance parameters when compared to Comparative Example 1. Further, the efficiency increased by more than 30 percent after the light-soaking treatment. FIG. 8 further shows the ideality factor for devices subjected to light-soaking treatment versus the un-treated device. As indicated, in FIG. 8, the ideality factor decreased after the light-soaking treatment, indicating an improved device.

Example 2

Effect of Cadmium Sulfide Thickness on Device Performance after Light-Soaking

The method of making the photovoltaic device was similar to the Comparative Example 1, except after the step of back contact formation, the device was loaded into an accelerated lifetime conditioning chamber, and subjected to light-soaking at 65° C. using 0.7 Sun light intensity for 168 to 216 hours, under open-circuit conditions.

Figure 9:
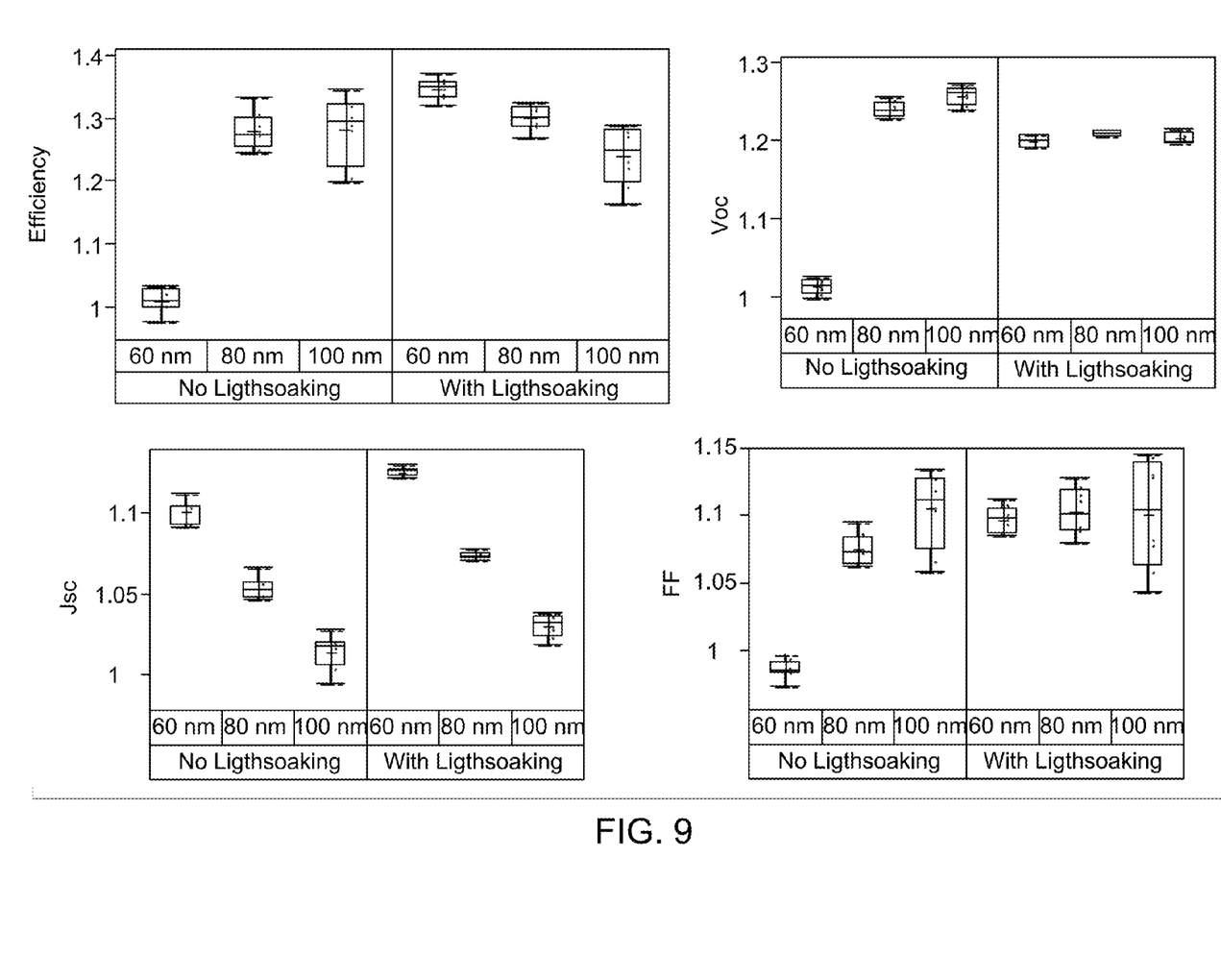
FIG. 9 shows the effect of window layer thickness on the normalized performance parameters for devices subjected to the light-soaking treatment versus the un-treated photovoltaic devices.

FIG. 9 shows the normalized (with respect to 60 nm) performance parameters, such as, efficiency, $V_{OC}$, $J_{SC}$, and FF for devices subjected to the light-soaking step versus the un-treated devices. As illustrated in FIG. 9, the devices with the thicker (80 nm, 100 nm) CdS layer initially showed higher efficiency values than the device with the thinner (60 nm) CdS layer. However, after the light-soaking treatment, the thinner CdS device showed improved performance parameters and higher efficiency values.

Figure 10:
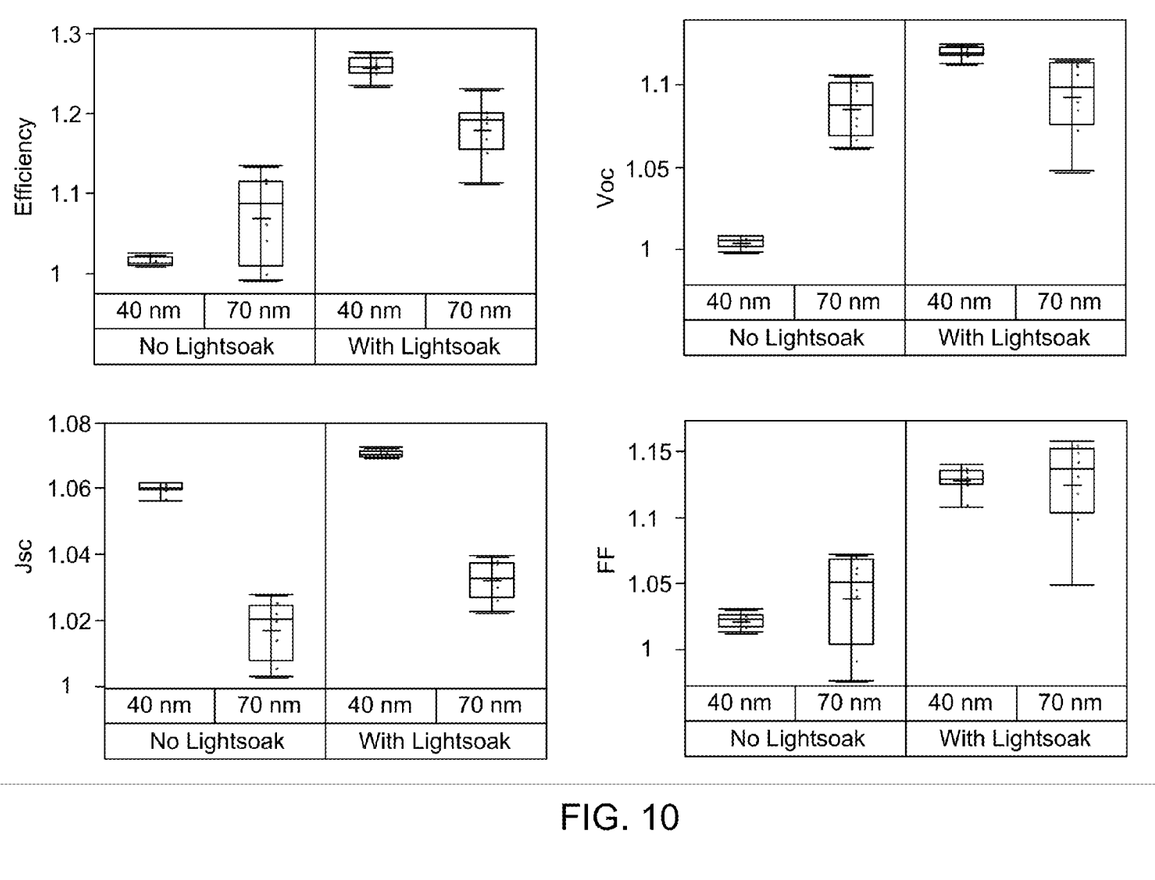
FIG. 10 shows the effect of window layer thickness on the normalized performance parameters for devices subjected to the light-soaking treatment versus the un-treated photovoltaic devices.

Similarly, FIG. 10 shows the normalized (with respect to 40 nm) performance parameters, for devices subjected to the light-soaking step versus the un-treated devices. As illustrated in FIG. 10, the device with the thicker (70 nm) CdS layer initially showed higher efficiency values than the device with the thinner (40 nm) CdS layer. However, after the light-soaking treatment, the thinner CdS (40 nm) device showed improved performance parameters and higher efficiency values. Without being bound by any theory, it is believed that the combination of the thin CdS window layer with the efficiency enhancement treatment may allow for fabrication of modules with the desired efficiency values, while reducing the cost of CdS used.

Example 3

Effect of Temperature on Device Performance after Light-Soaking

The method of making the photovoltaic device was similar to the Comparative Example 1, except after the step of back contact formation, the device was loaded into an accelerated lifetime conditioning chamber, and subjected to light-soaking at three different temperatures (105° C., 125° C., and 145° C.) using 0.7 Sun light intensity, under open-circuit conditions.

Figure 11:
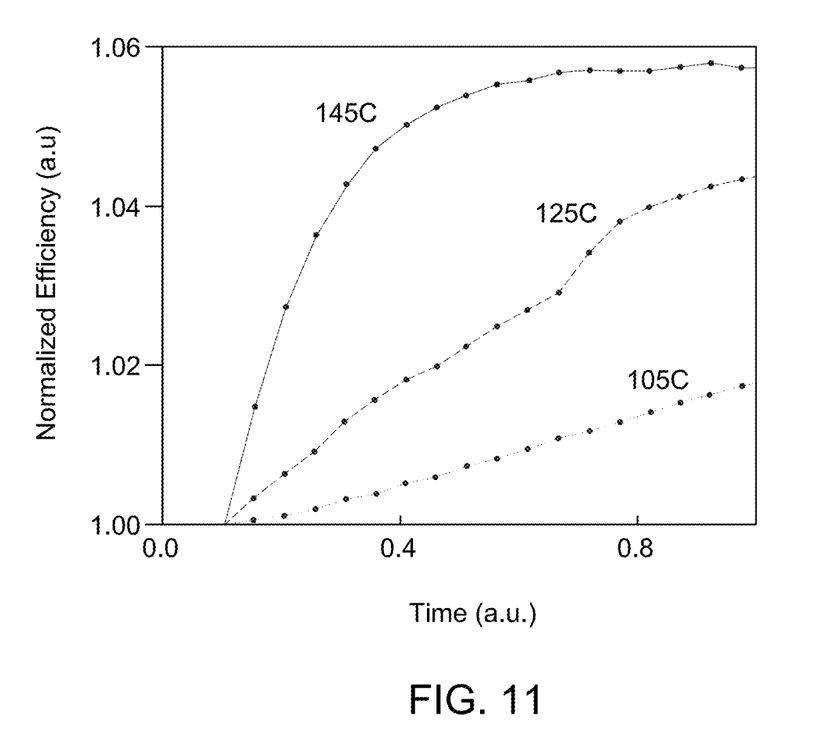
FIG. 11 shows the effect of temperature on the normalized efficiency values for devices subjected to the light-soaking treatment.

FIG. 11 shows the normalized efficiency values as a function of light-soaking duration for three different temperatures. As illustrated in FIG. 11, temperatures greater than 105° C., during the light-soaking treatment, resulted in efficiency improvement over a certain period of time. Further, by using temperatures greater than 105° C., the efficiency improvement was faster, which may result in shorter fabrication time.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A method, comprising:
   fabricating a photovoltaic module comprising a semiconductor assembly;
   wherein the fabrication step comprises performing an efficiency enhancement treatment on the semiconductor assembly;
   wherein the efficiency enhancement treatment comprises light soaking the semiconductor assembly, and heating the semiconductor assembly;
   wherein the efficiency enhancement treatment comprises an accelerated lifetime light-soaking treatment;
   wherein the semiconductor assembly comprises a window layer having an average thickness less than about 80 nanometers, and wherein the window layer comprises cadmium and sulfur.

2. The method of claim 1, wherein the efficiency enhancement step comprises heating the semiconductor assembly at a temperature greater than 65° C.

3. The method of claim 1, wherein the efficiency enhancement step comprises heating the semiconductor assembly at a temperature greater than 105° C.

4. The method of claim 1, wherein the efficiency enhancement step comprises heating the semiconductor assembly at a temperature in a range from 105° C. to 200° C.

5. The method of claim 1, wherein light soaking step comprises exposing the semiconductor assembly to a light intensity in a range from about 0.01 Sun to about 10 Sun.

6. The method of claim 1, wherein the efficiency enhancement step comprises heating the semiconductor assembly for a time duration less than about 20 hours.

7. The method of claim 1, wherein the efficiency enhancement step comprises heating the semiconductor assembly for a time duration less than about 10 hours.

8. The method of claim 1, wherein the efficiency enhancement step comprises light soaking the semiconductor assembly under open-circuit conditions.

9. The method of claim 1, wherein the fabrication step further comprises a step of forming the semiconductor assembly, the forming step comprising:
   disposing a transparent conductive layer on a first support;
   disposing the window layer on a transparent conductive layer;
   disposing an absorber layer on the window layer; and
   disposing a back contact layer on the absorber layer.

10. The method of claim 9, wherein the efficiency enhancement step is effected simultaneously with, or after the step of disposing the back contact layer on the absorber layer.

11. The method of claim 9, wherein the efficiency enhancement step is effected before the step of disposing the back contact layer on the absorber layer.

12. The method of claim 9, wherein the fabrication step further comprises laminating a back substrate to the back contact layer, and wherein the energy enhancement step is effected simultaneously with, or after the lamination step.

13. The method of claim 9, wherein the fabrication step further comprises laminating a back substrate to the back contact layer, and wherein the energy enhancement step is effected before the lamination step.

14. The method of claim 1, wherein the steps of light soaking and heating the semiconductor assembly are effected simultaneously.

15. The method of claim 1, wherein the window layer comprises cadmium sulfide, oxygenated cadmium sulfide, cadmium zinc sulfide, or combinations thereof.

16. The method of claim 1, wherein the window layer has an average thickness less than about 60 nanometers.

17. The method of claim 1, wherein the window layer comprises a discontinuous layer.

18. The method of claim 9, wherein the absorber layer comprises cadmium telluride, cadmium zinc telluride, cadmium sulfur telluride, cadmium manganese telluride, cadmium magnesium telluride, or combinations thereof.

19. The method of claim 18, wherein at least a portion of the absorber layer further comprises at least one element from Group IB.

20. A method, comprising:
fabricating a photovoltaic module
wherein the fabrication step comprises performing an efficiency enhancement treatment on a semiconductor assembly;
wherein the efficiency enhancement treatment comprises light soaking the semiconductor assembly, and heating the semiconductor assembly;
wherein the efficiency enhancement treatment comprises an accelerated lifetime light-soaking treatment;
wherein the semiconductor assembly comprises an absorber layer, and wherein the absorber layer comprises cadmium and tellurium.

21. The method of claim 20, wherein the semiconductor assembly comprises a plurality of layers disposed in a superstrate configuration.

22. The method of claim 20, wherein the semiconductor assembly comprises a window layer, and wherein the window layer comprises cadmium and sulfur.

23. The method of claim 20, wherein the semiconductor assembly comprises a window layer, and wherein the window layer comprises cadmium and selenium.

24. The method of claim 22, wherein the window layer has an average thickness less than about 80 nanometers.

* * * * *